United States Patent [19]

Yoshida et al.

[11] Patent Number: 5,360,785
[45] Date of Patent: Nov. 1, 1994

[54] IN-SITU LASER ABLATION METHOD FOR FORMING OXIDE SUPERCONDUCTING FILMS

[75] Inventors: Noriyuki Yoshida; Satoshi Takano; Shigeru Okuda; Noriki Hayashi, all of Osaka; Tsukushi Hara, Chofu; Kiyoshi Okaniwa, Chofu; Takahiko Yamamoto, Chofu, all of Japan

[73] Assignees: Sumitomo Electric Industries, Ltd., Osaka; The Toyko Electric Power Company, Incorporated, Tokyo, both of Japan

[21] Appl. No.: 59,428

[22] Filed: May 7, 1993

Related U.S. Application Data

[63] Continuation of Ser. No. 832,670, Feb. 6, 1992, abandoned, which is a continuation of Ser. No. 683,938, Apr. 11, 1991, abandoned.

[30] Foreign Application Priority Data

Mar. 11, 1990 [JP] Japan ................................. 3-045059
Apr. 11, 1990 [JP] Japan ................................. 2-95495

[51] Int. Cl.$^5$ ........................... B05D 3/06; B05D 5/12
[52] U.S. Cl. ......................... 505/474; 505/732; 505/730; 427/596; 427/62; 427/126.3; 427/314
[58] Field of Search .................... 505/1, 732, 730; 427/62, 63, 596, 126.3, 314

[56] References Cited

FOREIGN PATENT DOCUMENTS 0341520 11/1989 European Pat. Off. .

OTHER PUBLICATIONS

Lynds et al, "Superconducting Thin Films of Y–Ba–Cu–O Produced by Neodymium: Yttrium Aluminum Garnet Laser Ablation", Appl. Phys. lett. 52(4) Jan. 1988 pp. 320-322.

Wu et al;, "Effect of Deposition Rate on Properties of $YBa_2Cu_3O_{7-\delta}$ Superconducting Thin Films," Appl. Phys. lett. 56(15) Apr. 9, 1990 pp. 1481-1483.

Singh et al, "Insitu Processing of Epitiaxial Y–Ba–Cu–O High Tc Superconducting Films on (100) $SrTiO_3$ and (100) $YS-ZrO_2$ Substrates at 500°-650° C.," Appl. Phys. Lett. 54(2) May 1989 pp. 2271-2273.

Balooch et al, "Y–Ba–Cu–O Superconducting Films Produced by Long-Pulse Laser Vaporization," Appl. Phys. Lett. 55(2) Jul. 1989 pp. 197-199.

Koren et al, "Laser Wavelength Dependent Properties of $YBa_2Cu_3O_{7-\delta}$ Thin Films Deposited by Laser Ablation", Appl. Phys. Lett. 55(23) Dec. 1989 pp. 2450-2452.

B. Roas et al, "Epitaxial Growth of $YBa_2Cu_3O_{7-x}$ Thin Films by a Laser Evaporation Process," App. Phys. Lett., 53(16), 1988, pp. 1557-1559.

Primary Examiner—Roy V. King

[57] ABSTRACT

In a method of preparing an oxide superconducting thin film having a composition of Y-Ba-Cu-O, for example, using laser ablation, which comprises the steps of applying a laser beam to a target containing components of an oxide superconductive material and depositing particles, being thereby scattered from the target, on a substrate, the oxygen gas flow rate during film deposition is set to be at least 50 SCCM, the oxygen gas pressure during film deposition is set to be 10 to 1000 mTorr, the distance between a target 9 and a substrate 10 is set to be 40 to 100 mm, the temperature of the substrate 10 is set to be 600° to 800° C., the energy density of a laser beam 7 on the surface of the target 9 is set to be at least 1 $J/cm^2$, and the laser pulse energy is set to be at least 10 mJ.

2 Claims, 1 Drawing Sheet

IN-SITU LASER ABLATION METHOD FOR FORMING OXIDE SUPERCONDUCTING FILMS

This is a continuation of application Ser. No. 07/832,670, filed Feb. 6, 1992, now abandoned, which is a continuation of application Ser. No. 07/683,938, filed Apr. 11, 1991, now abandoned.

BACKGROUND OF THE INVENTION

1. Field of the Invention

The present invention relates to a method of preparing an oxide superconducting film using laser ablation.

2. Description of the Background Art

A method of forming an oxide superconducting film by laser ablation with an excimer laser beam, for example, is watched with interest in the point that it is possible to easily implement a high-quality film. In general, a pulse laser beam is employed for laser ablation.

In such laser ablation, the film has generally been formed at a relatively low film deposition rate with a pulsed laser repetition rate of not more than 10 Hz. According to published literature such as Appl. Phys. Lett., Vol. 53, No. 16, pp. 1557–1559 (1988), "Epitaxial growth of $YBa_2Cu_3O_{7-x}$ thin films by a laser evaporation process", for example, the known maximum film deposition rate is 1200 Å/min. In p. 1557, the above literature describes film deposition conditions of 4 Å/pulse and 1500 laser pulses for 5 minutes, which result in the aforementioned film deposition rate of 1200 Å/min.

The maximum film deposition rate has been thus limited to 1200 Å/min., for example, in general laser ablation conceivably for the reasons that this film deposition rate is sufficiently higher than those in other film deposition techniques such as sputtering, vacuum deposition etc. and no higher rate is required in application to the field of electronics, and that superconducting properties of the as-deposited oxide superconducting film are reduced at a higher film deposition rate.

When an oxide superconducting film is formed by ordinary laser ablation, the film deposition rate is increased by increase of the repetition rate. However, if the film deposition rate is increased in excess of 2000 Å/min., for example, the oxide superconducting film is obtained as an aggregate of fine crystal grains of not more than 1 μm, to develop clear grain boundaries. This leads to reduction in critical temperature and critical current density.

Up to now, therefore, it has been impossible to implement a high-quality oxide superconducting film having excellent superconducting properties at a high film deposition rate.

SUMMARY OF THE INVENTION

Accordingly, an object of the present invention is to provide a method of preparing an oxide superconducting film, whose superconducting properties are not much reduced even if the same is formed at a higher rate than those in conventional methods.

The present invention is directed to a method of preparing an oxide superconducting film using laser ablation, comprising the steps of applying a laser beam to a target containing components of an oxide superconductive material, and depositing particles, which are thereby scattered from the target, on a substrate.

In relation to such a method of preparing an oxide superconducting film using laser ablation, the inventors have found that it is possible to obtain an oxide superconducting film having excellent superconducting properties at a high film deposition rate by selecting film deposition conditions, i.e., the oxygen gas flow rate and the oxygen gas pressure during film deposition, the target-to-substrate distance, the substrate temperature, the energy density of the laser beam on the target surface and the laser pulse energy in more specific terms, in prescribed ranges respectively.

The inventive method of preparing an oxide superconducting film has the following features:

a. the oxygen gas flow rate during film deposition is at least 50 SCCM;

b. the oxygen gas pressure during film deposition is 10 to 1000 mTorr;

c. the target-to-substrate distance is 40 to 100 mm;

d. the substrate temperature is 600 to 800° C.;

e. the energy density of the laser beam on the target surface is at least 1 J/cm$^2$; and f. the laser pulse energy is at least 100 mJ.

The present invention is advantageously applicable to preparation of a yttrium-system oxide superconducting film having a composition of Y-Ba-Cu-O, for example.

According to the present invention, it is possible to obtain a high-quality oxide superconducting film having excellent superconducting properties at a film deposition rate of at least 2000 Å/min., as clearly understood from Examples described later. In other words, superconducting properties of the as-deposited oxide superconducting film are not substantially reduced even if the film deposition rate is in excess of 2000 Å/min. Therefore, it can be said that the present invention has a particularly remarkable effect at a film deposition rate exceeding 2000 Å/min.

Thus, the present invention can effectively improve the quality of an oxide superconducting film at a high film deposition rate, and hence the same is particularly effectively applied to preparation of an oxide superconducting wire which is obtained by employing a long tape-type base material, for example, as a substrate, and continuously forming an oxide superconducting film thereon.

These and other objects, features, aspects and advantages of the present invention will become more apparent from the following detailed description of the present invention when taken in conjunction with the accompanying drawing.

DESCRIPTION OF THE PREFERRED EMBODIMENTS

Figure 1:
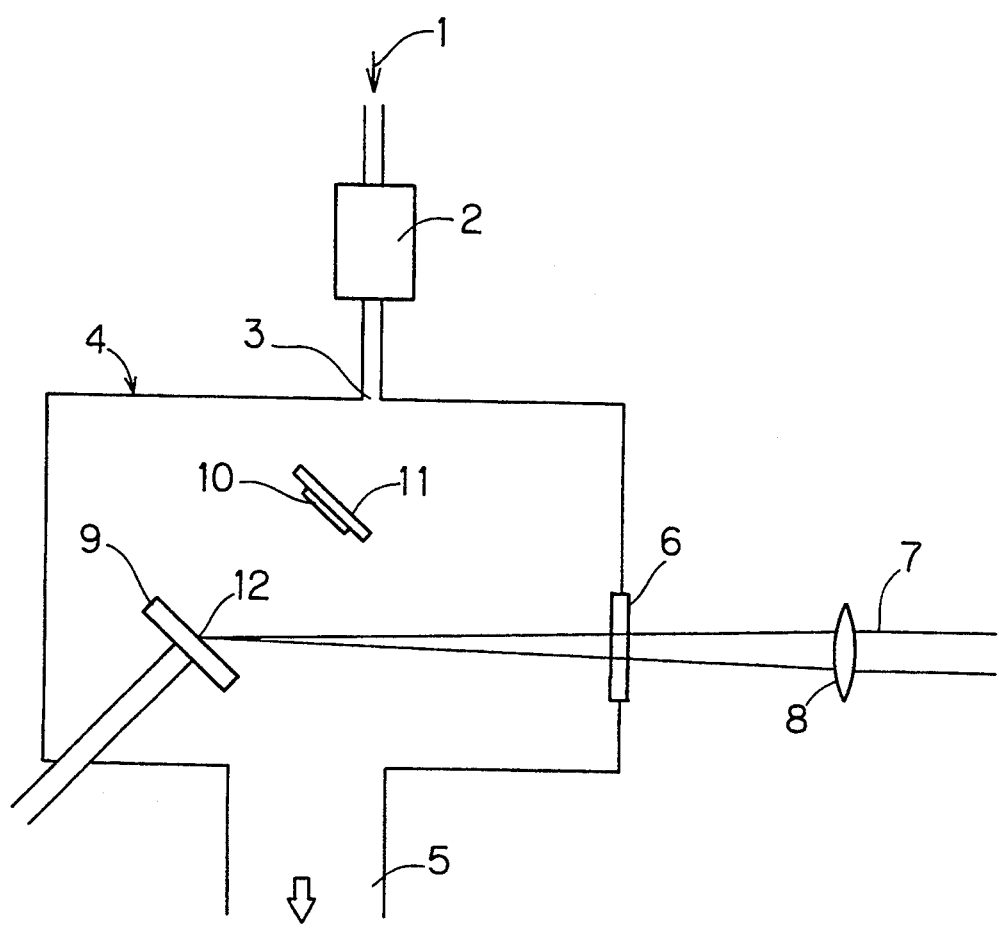
FIG. 1 is a sectional view illustrating a film deposition apparatus which is adapted to carry out an embodiment of the present invention.

FIG. 1 shows a state of carrying out an embodiment of the present invention.

Gaseous oxygen, which is supplied along an arrow 1, is flow-controlled by a flow controller 2, and then introduced into a film deposition chamber 4 from an inlet 3. An evacuation port 5 is provided in another position of the film deposition chamber 4, and the displacement of a vacuum pump (not shown), which is connected to the evacuation port 5, is adjusted by a control valve or the like, so that the oxygen gas pressure in the film deposition chamber 4 can be maintained at a prescribed value.

A window 6 of synthetic quartz glass, for example, is provided on a wall portion of the film deposition chamber 4. A laser beam 7 is focused by a condenser lens 8, and introduced into the film deposition chamber 4 through the window 6.

In the film deposition chamber 4, the laser beam 7 is applied to the surface of a target 9, which is prepared from a sintered body of an oxide superconductive material such as $Y_1Ba_2Cu_3O_x$, for example. A substrate 10 is held on a substrate holder 11, which contains a heater for heating the substrate 10. The substrate 10 is arranged to be parallel to the target 9 along a normal through a position 12, which is irradiated with the laser beam 7, of the target 9.

The point of the present invention resides in that film deposition conditions which can attain a high-quality oxide superconducting film at a high film deposition rate exceeding 2000 Å/min., for example, have been found. Six film deposition conditions a to f are defined in claims. When these film deposition conditions are satisfied, a high-quality oxide superconducting film can be obtained even if the film is formed at a high rate. However, it is impossible to obtain an oxide superconducting film having excellent superconducting properties if at least one of these conditions is not satisfied.

Experimental Examples carried out for deciding the film deposition conditions are now described. These Experimental Examples prove that it is impossible to obtain an oxide superconducting film having excellent superconducting properties at a high film deposition rate exceeding 2000 Å/min., for example, if any one of the film deposition conditions is not satisfied. Six Experimental Examples have been carried out in correspondence to the aforementioned six film deposition conditions.

The film deposition apparatus shown in FIG. 1 was employed for every Experimental Example with a substrate 10 of single-crystalline MgO (100), a KrF excimer laser beam 7 of 248 nm in wavenlength, and a target 9 of a $Y_1Ba_2Cu_3O_x$ sintered body, to form a $Y_1Ba_2Cu_3O_x$ oxide superconducting film on a substrate 10. In order to investigate changes of the superconducting properties caused by increase of the film deposition rate in every Experimental Example, the laser repetition rate [Hz] was varied in a range of 1, 5, 10, 20, 30, 50, 100, 200 and 250 for changing the film deposition rate, to evaluate the superconducting properties of samples obtained under the respective repetition rates.

EXPERIMENTAL EXAMPLE 1

Oxygen Gas Flow Rate

Except for the laser repetition rate and the oxygen gas flow rate during film deposition as described above, the film deposition conditions were set as follows:

Oxygen Gas Pressure during Film Deposition: 200 mTorr
Target-to-Substrate Distance: 70 mm
Substrate Temperature: 675° C.
Energy Density of laser Beam on Target Surface: 2.5 J/cm$^2$
Laser Pulse Energy: 350 mJ The oxygen gas flow rate [SCCM] during film deposition was varied as shown in Table 1, to form films under the respective repetition rates.

TABLE 1

| Repetition Rate | | 1 | 5 | 10 | 20 | 30 | 50 | 100 | 200 | 250 |
|---|---|---|---|---|---|---|---|---|---|---|
| Oxygen Gas Flow | 30 | $1.2 \times 10^6$ | $2.3 \times 10^5$ | $1.2 \times 10^3$ | 0 | 0 | 0 | 0 | $8.3 \times 10^2$ | $2.6 \times 10^2$ |
| Rate During Film | 40 | $1.4 \times 10^6$ | $1.3 \times 10^6$ | $1.2 \times 10^6$ | $1.4 \times 10^6$ | $2.2 \times 10^5$ | $1.2 \times 10^4$ | $1.3 \times 10^3$ | $4.2 \times 10^5$ | $2.1 \times 10^4$ |
| Deposition | 50 | $1.2 \times 10^6$ | $1.4 \times 10^6$ | $1.1 \times 10^6$ | $1.5 \times 10^6$ | $1.0 \times 10^6$ | $9.5 \times 10^5$ | $9.2 \times 10^5$ | $1.6 \times 10^6$ | $1.1 \times 10^6$ |
| | 60 | $2.3 \times 10^6$ | $2.5 \times 10^6$ | $2.2 \times 10^6$ | $2.0 \times 10^6$ | $1.7 \times 10^6$ | $1.3 \times 10^6$ | $1.5 \times 10^6$ | $1.1 \times 10^6$ | $1.2 \times 10^6$ |
| | 70 | $3.1 \times 10^6$ | $3.4 \times 10^6$ | $3.2 \times 10^6$ | $2.8 \times 10^6$ | $2.3 \times 10^6$ | $1.8 \times 10^6$ | $1.4 \times 10^6$ | $9.8 \times 10^5$ | $1.2 \times 10^6$ |
| Film Deposition Rate | | 65 | 320 | 705 | 1390 | 2250 | 3670 | 7820 | 16200 | 18950 |

Referring to Table 1, the numerals listed with no item names show critical current densities, which were measured at the boiling point of 77.3K of liquid nitrogen, in units of [A/cm$^2$]. In the samples showing critical current densities of "0", superconductivity transition temperatures were less than the boiling point of 77.3K of liquid nitrogen and no critical current flowed at the temperature of 77.3K. This also applies to Experimental Examples 2 to 6 described later.

Referring to Table 1, further, the film deposition rates represent average values of those obtained under various oxygen gas flow rates during film deposition, in units of [Å/min.].

It is clearly understood from Table 1 that critical current densities of at least or substantially equal to $1 \times 10^6$ Å/cm$^2$ were obtained at the film deposition rates exceeding 2250 Å/min., when the oxygen gas flow rates during film deposition were in excess of 50 SCCM. When the oxygen gas flow rates during film deposition were less than 50 SCCM, on the other hand, the properties were abruptly reduced at the film deposition rates exceeding 2000 Å/min., although it was possible to attain high properties at the film deposition rates of not more than 20000 Å/min.

EXPERIMENTAL EXAMPLE 2

Oxygen Gas Pressure

Except for the laser repetition rate and the oxygen gas pressure during film deposition, the film deposition conditions were set as follows:

Oxygen Gas Flow Rate during Film Deposition: 100 SCCM
Target-to-Substrate Distance: 70 mm
Substrate Temperature: 700° C.
Energy Density of Laser Beam on Target Surface: 1.5 J/cm$^2$
Laser Pulse Energy: 390 mJ The oxygen gas pressure [mTorr] during film deposition was varied as shown in Table 2, to form films under the respective repetition rates. As to the numerical values shown in Table 2 with no item names, the upper values show critical current densities [A/cm$^2$], and the lower values show film deposition rates [Å/min.].

TABLE 2

| Repetition Rate | | 1 | 5 | 10 | 20 | 30 | 50 | 100 | 200 | 250 |
|---|---|---|---|---|---|---|---|---|---|---|
| Oxgen Gas Pressure | 5 | $1.3 \times 10^2$ | $1.4 \times 10^3$ | 0 | 0 | 0 | 0 | 0 | 0 | 0 |

TABLE 2-continued

| Repetition Rate | | 1 | 5 | 10 | 20 | 30 | 50 | 100 | 200 | 250 |
|---|---|---|---|---|---|---|---|---|---|---|
| During Film Deposition | | 72 | 280 | 420 | 790 | 1120 | 1600 | 3200 | 6600 | 8100 |
| | 10 | $4.5 \times 10^5$ | $4.2 \times 10^5$ | $4.3 \times 10^5$ | $2.8 \times 10^5$ | $4.0 \times 10^5$ | $3.8 \times 10^5$ | $3.1 \times 10^5$ | $2.7 \times 10^5$ | $2.2 \times 10^5$ |
| | | 55 | 290 | 590 | 1060 | 1520 | 2630 | 5190 | 11200 | 13800 |
| | 50 | $1.8 \times 10^6$ | $1.6 \times 10^6$ | $1.4 \times 10^6$ | $1.2 \times 10^6$ | $9.2 \times 10^5$ | $6.3 \times 10^5$ | $6.2 \times 10^5$ | $5.8 \times 10^5$ | $5.9 \times 10^5$ |
| | | 63 | 310 | 620 | 1210 | 1790 | 3110 | 6150 | 12200 | 15600 |
| | 100 | $2.7 \times 10^6$ | $1.9 \times 10^6$ | $1.8 \times 10^6$ | $2.5 \times 10^6$ | $2.2 \times 10^6$ | $2.1 \times 10^6$ | $1.9 \times 10^6$ | $1.3 \times 10^6$ | $1.1 \times 10^6$ |
| | | 69 | 320 | 670 | 1290 | 2010 | 3190 | 6450 | 12800 | 16200 |
| | 300 | $2.5 \times 10^6$ | $2.2 \times 10^6$ | $1.9 \times 10^6$ | $1.3 \times 10^6$ | $1.1 \times 10^6$ | $1.5 \times 10^6$ | $8.9 \times 10^5$ | $1.1 \times 10^6$ | $9.2 \times 10^5$ |
| | | 72 | 320 | 700 | 1380 | 2110 | 3100 | 6320 | 13000 | 16300 |
| | 500 | $2.8 \times 10^6$ | $2.3 \times 10^6$ | $3.0 \times 10^6$ | $2.5 \times 10^6$ | $1.9 \times 10^6$ | $1.7 \times 10^6$ | $1.2 \times 10^6$ | $1.1 \times 10^6$ | $9.8 \times 10^5$ |
| | | 81 | 330 | 720 | 1410 | 2200 | 3200 | 6010 | 12300 | 16100 |
| | 1000 | $1.9 \times 10^6$ | $1.5 \times 10^6$ | $1.9 \times 10^6$ | $1.3 \times 10^6$ | $1.5 \times 10^6$ | $1.3 \times 10^6$ | $1.1 \times 10^6$ | $9.3 \times 10^5$ | $8.7 \times 10^5$ |
| | | 70 | 320 | 710 | 1390 | 2100 | 3300 | 6500 | 13100 | 16200 |
| | 1200 | $1.3 \times 10^6$ | $1.2 \times 10^6$ | $1.5 \times 10^6$ | $9.1 \times 10^5$ | $1.2 \times 10^4$ | $1.1 \times 10^3$ | 0 | 0 | 0 |
| | | 60 | 330 | 630 | 1290 | 2110 | 3260 | 6600 | 13500 | 16300 |

It is clearly understood from Table 2 that the critical current densities were extremely reduced or zeroed when the oxygen gas pressures during film deposition were below 10 mTorr, as in the case of 5 mTorr, regardless of the film deposition rates.

When the oxygen gas pressures were 10 mTorr, the samples attained critical current densities along the order of $10^5$ A/cm$^2$, at the film deposition rates exceeding 2000 Å/min. When the oxygen gas pressures were selected in the range of 10 to 1000 mTorr, it was possible to maintain high properties at the film deposition rates exceeding 2000 Å/min.

When the oxygen gas pressures exceeded 1000 mTorr as in the case of 1200 mTorr, on the other hand, the properties were significantly reduced at the film deposition rates exceeding 2000 Å/min.

EXPERIMENTAL EXAMPLE 3

Target-to-Substrate Distance

Except for the laser repetition rate and the target-to-substrate distance, the film deposition conditions were set as follows:
Oxygen Gas Flow Rate during Film Deposition: 100 SCCM
Oxygen Gas Pressure during Film Deposition: 200 mTorr
Substrate Temperature: 700° C.
Laser Energy Density on Target Substrate: 1.5 J/cm$^2$
Laser Pulse Energy: 390 mJ The target-to-substrate distance [mm] was varied as shown in Table 3, to form films under the respective repetition rates.

As to the numerical values listed with no item names in Table 3, the upper values show critical current densities [A/cm$^2$] and the lower values show film deposition rates [Å/min.], similarly to Table 2.

TABLE 3

| Repetition Rate | | 1 | 5 | 10 | 20 | 30 | 50 | 100 | 200 | 250 |
|---|---|---|---|---|---|---|---|---|---|---|
| Target-to-Substrate Distance | 30 | $2.6 \times 10^3$ | $1.3 \times 10^2$ | $1.1 \times 10^2$ | 0 | 0 | 0 | 0 | 0 | 0 |
| | | 255 | 1320 | 2750 | 5210 | 8250 | 14100 | 29200 | 61000 | 78000 |
| | 40 | $2.1 \times 10^6$ | $1.1 \times 10^6$ | $1.3 \times 10^6$ | $9.8 \times 10^5$ | $9.3 \times 10^5$ | $1.1 \times 10^6$ | $1.0 \times 10^6$ | $8.4 \times 10^5$ | $8.2 \times 10^5$ |
| | | 148 | 692 | 1530 | 3090 | 4710 | 7800 | 16200 | 33000 | 41000 |
| | 60 | $3.5 \times 10^6$ | $3.1 \times 10^6$ | $2.1 \times 10^6$ | $1.5 \times 10^6$ | $1.8 \times 10^6$ | $1.2 \times 10^6$ | $1.5 \times 10^6$ | $1.0 \times 10^6$ | $9.2 \times 10^5$ |
| | | 62 | 300 | 650 | 1290 | 1910 | 3410 | 6670 | 13500 | 17100 |
| | 80 | $1.8 \times 10^6$ | $2.5 \times 10^6$ | $2.1 \times 10^6$ | $2.7 \times 10^6$ | $1.9 \times 10^6$ | $1.8 \times 10^6$ | $1.3 \times 10^6$ | $1.4 \times 10^6$ | $1.0 \times 10^6$ |
| | | 31 | 160 | 330 | 670 | 1020 | 1710 | 3050 | 6200 | 8100 |
| | 100 | $1.3 \times 10^6$ | $1.7 \times 10^6$ | $1.4 \times 10^6$ | $1.7 \times 10^6$ | $1.3 \times 10^6$ | $1.1 \times 10^6$ | $1.5 \times 10^6$ | $9.8 \times 10^5$ | $1.0 \times 10^6$ |
| | | 21 | 110 | 230 | 440 | 710 | 1250 | 2410 | 4400 | 5750 |
| | 110 | $1.5 \times 10^6$ | $1.7 \times 10^6$ | $2.3 \times 10^6$ | $1.9 \times 10^6$ | $1.6 \times 10^6$ | $1.3 \times 10^6$ | $1.3 \times 10^4$ | $1.1 \times 10^3$ | 0 |
| | | 16 | 89 | 187 | 361 | 560 | 1020 | 2200 | 4500 | 5710 |

It is clearly understood from Table 3 that the critical current densities were extremely reduced or zeroed when the target-to-substrate distances were below 40 mm as in the case of 30 mm, regardless of the film deposition rates.

When the target-to-substrate distances were in the range of 40 to 100 mm, on the other hand, it was possible to maintain high critical current densities at the film deposition rates exceeding 2000 Å/min.

When the target-to-substrate distances exceeded 100 mm, as in the case of 110 mm, the critical current densities were extremely reduced at the film deposition rates exceeding 2000 Å/min.

EXPERIMENTAL EXAMPLE 4

Substrate Temperature

Except for the laser repetition rate and the substrate temperature, the film deposition conditions were set as follows:
Oxygen Gas Flow Rate during Film Deposition: 100 SCCM
Oxygen Gas Pressure during Film Deposition: 200 mTorr
Target-to-Substrate Distance: 70 mm
Laser Energy Density on Target Surface: 2.5 J/cm$^2$
Laser Pulse Energy: 400 mJ The substrate temperature [°C.] was varied as shown in Table 4, to form films under the respective repetition rates.

As to the numerical values listed with no item names in Table 4, the upper values show critical temperatures and the lower values show critical current densities [A/cm$^2$]. The film deposition rates represent average values of those for forming the films at various substrate temperatures, in units of [Å/min.].

the lower values show critical current densities [A/cm$^2$]. The parenthesized numerical values show film

TABLE 4

| Repetition Rate | | 1 | 5 | 10 | 20 | 30 | 50 | 100 | 200 | 250 |
|---|---|---|---|---|---|---|---|---|---|---|
| Substrate Temperature | 550 | 17K<br>0 | <4.2K<br>0 | <4.2K<br>0 | <4.2K<br>0 | <4.2K<br>0 | <4.2K<br>0 | <4.2K<br>0 | <4.2K<br>0 | <4.2K<br>0 |
| | 600 | 83K<br>1.3 × 10$^6$ | 82K<br>1.2 × 10$^6$ | 83K<br>1.1 × 10$^6$ | 83K<br>9.5 × 10$^5$ | 82K<br>3.8 × 10$^5$ | 83K<br>3.7 × 10$^5$ | 81K<br>2.9 × 10$^5$ | 82K<br>2.6 × 10$^5$ | 81K<br>2.3 × 10$^5$ |
| | 700 | 91K<br>3.5 × 10$^6$ | 90K<br>3.3 × 10$^6$ | 87K<br>4.1 × 10$^6$ | 88K<br>3.1 × 10$^6$ | 89K<br>2.5 × 10$^6$ | 86K<br>1.8 × 10$^6$ | 85K<br>1.9 × 10$^6$ | 84K<br>1.8 × 10$^6$ | 84K<br>1.2 × 10$^6$ |
| | 800 | 87K<br>2.1 × 10$^6$ | 87K<br>2.5 × 10$^6$ | 86K<br>1.9 × 10$^6$ | 87K<br>1.4 × 10$^6$ | 88K<br>1.2 × 10$^6$ | 87K<br>1.3 × 10$^6$ | 88K<br>1.5 × 10$^6$ | 89K<br>1.6 × 10$^6$ | 87K<br>1.1 × 10$^6$ |
| | 850 | 88K<br>1.5 × 10$^6$ | 88K<br>1.3 × 10$^6$ | 86K<br>1.7 × 10$^6$ | 84K<br>8.2 × 10$^5$ | 84K<br>3.8 × 10$^5$ | 35K<br>0 | 10K<br>0 | 4.2K<br>0 | 4.2K<br>0 |
| Film Deposition Rate | | 65 | 315 | 628 | 1250 | 1890 | 3350 | 6790 | 13700 | 17500 |

It is clearly understood from Table 4 that superconducting properties such as the critical temperatures and the critical current densities were deteriorated when the substrate temperatures were below 600° C., as in the case of 550° C., regardless of the film deposition rates.

At the substrate temperatures of 600° to 800° C., on the other hand, high properties were maintained under the film deposition rates exceeding 2000 Å/min.

When the substrate temperatures exceeded 800° C. as in the case of 850° C., the properties were significantly reduced at the film deposition rates exceeding 2000 Å/min.

EXPERIMENTAL EXAMPLE 5

Laser Energy Density

Except for the laser repetition rate and the laser energy density on the target surface, the film deposition conditions were set as follows:

Oxygen Gas Flow Rate during Film Deposition: 100 SCCM
Oxygen Gas Pressure during Film Deposition: 200 mTorr
Target-to-Substrate Distance: 70 mm
Substrate Temperature: 650° C.
Laser Pulse Energy: 400 mJ The laser energy density [J/cm$^2$] on the target surface was varied as shown in Table 5, to form films under the respective repetition rates.

As to the numerical values listed with no item names in Table 5, upper values show critical temperatures, and the lower values show critical current densities [A/cm$^2$]. The parenthesized numerical values show film deposition rates [Å/min.].

TABLE 5

| Repetition Rate | | 1 | 5 | 10 | 20 | 30 | 50 | 100 | 200 | 250 |
|---|---|---|---|---|---|---|---|---|---|---|
| Energy Density | 0.2 | <4.2K<br>0 | <4.2K<br>0 | <4.2K<br>0 | <4.2K<br>0 | <4.2K<br>0 | <4.2K<br>0 | <4.2K<br>0 | <4.2K<br>0 | <4.2K<br>0 |
| | 0.5 | <4.2K<br>0 | <4.2K<br>0 | <4.2K<br>0 | <4.2K<br>0 | <4.2K<br>0 | <4.2K<br>0 | <4.2K<br>0 | <4.2K<br>0 | <4.2K<br>0 |
| | 0.8 | 67K<br>0<br>(41) | 52K<br>0<br>(215) | 30K<br>0<br>(530) | <4.2K<br>0<br>(920) | <4.2K<br>0<br>(1750) | <4.2K<br>0<br>(2810) | <4.2K<br>0<br>(5680) | <4.2K<br>0<br>(12400) | <4.2K<br>0<br>(15200) |
| | 1 | 83K<br>1.8 × 10$^6$<br>(53) | 85K<br>1.5 × 10$^6$<br>(295) | 82K<br>1.9 × 10$^6$<br>(590) | 83K<br>1.7 × 10$^6$<br>(1150) | 82K<br>1.8 × 10$^6$<br>(1910) | 83K<br>1.2 × 10$^6$<br>(3050) | 82K<br>1.0 × 10$^6$<br>(6020) | 81K<br>3.2 × 10$^5$<br>(12300) | 81K<br>1.7 × 10$^5$<br>(15600) |
| | 2 | 91K<br>1.5 × 10$^6$<br>(60) | 90K<br>1.3 × 10$^6$<br>(315) | 89K<br>2.0 × 10$^6$<br>(628) | 90K<br>1.7 × 10$^6$<br>(1210) | 90K<br>1.4 × 10$^6$<br>(1830) | 88K<br>1.1 × 10$^6$<br>(3210) | 87K<br>1.1 × 10$^6$<br>(6310) | 86K<br>9.3 × 10$^5$<br>(12900) | 87K<br>8.4 × 10$^5$<br>(16100) |
| | 3 | 90K<br>1.3 × 10$^6$<br>(60) | 90K<br>1.2 × 10$^6$<br>(320) | 88K<br>2.0 × 10$^6$<br>(650) | 89K<br>1.7 × 10$^6$<br>(1350) | 87K<br>1.5 × 10$^6$<br>(2050) | 87K<br>1.1 × 10$^6$<br>(3300) | 87K<br>9.2 × 10$^5$<br>(6400) | 88K<br>5.3 × 10$^5$<br>(13100) | 88K<br>4.2 × 10$^5$<br>(16500) |

It is clearly understood from Table 5 that the superconducting properties were extremely deteriorated when the energy densities were less than 1 J/cm$^2$, as in the cases of 0.2 J/cm$^2$, 0.5 J/cm$^2$ and 0.8 J/cm$^2$.

When the energy densities were in excess of 1 J/cm$^2$, on the other hand, oxide superconducting films of high performance were obtained regardless of the film deposition rates.

EXPERIMENTAL EXAMPLE 6

Laser Pulse Energy

Except for the laser repetition rate and the laser pulse energy, the film deposition conditions were set as follows:

Oxygen Gas Flow Rate during Film Deposition: 100 SCCM
Oxygen Gas Pressure during Film Deposition: 200 mTorr
Target-to-Substrate Distance: 60 mm
Substrate Temperature: 750° C.
Laser Energy Density on Target Surface: 3 J/cm$^2$ The laser pulse energy [mJ] was varied as shown in Table 6, to form films under the respective repetition rates.

Referring to Table 6, the numerical values listed with no item names show critical temperatures, and the parenthesized numerical values show film deposition rates [Å/min.].

TABLE 6

| Repetition Rate | | 1 | 5 | 10 | 20 | 30 | 50 | 100 | 200 | 250 |
|---|---|---|---|---|---|---|---|---|---|---|
| Laser Energy | 8 | <4.2K | <4.2K | <4.2K | <4.2K | <4.2K | <4.2K | <4.2K | <4.2K | <4.2K |
| | 10 | 82K | 83K | 82K | 81K | 80K | 81K | 79K | 78K | 78K |
| | | (28) | (125) | (270) | (510) | (690) | (1300) | (2600) | (5200) | (6600) |
| | 15 | 83K | 83K | 81K | 84K | 79K | 80K | 80K | 79K | 78K |
| | | (28) | (139) | (290) | (580) | (820) | (1400) | (2900) | (6100) | (7300) |
| | 20 | 89K | 88K | 86K | 89K | 87K | 88K | 85K | 84K | 83K |
| | | (35) | (160) | (320) | (610) | (910) | (1600) | (3300) | (6800) | (8100) |

It is clearly understood from Table 6 that oxide superconducting films having high critical temperatures were obtained at the laser energy values exceeding 10 mJ, regardless of the film deposition rates.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of reducing grain boundaries of a high temperature oxide superconducting film prepared by an in situ laser ablation process at a deposition rate of at least 2000 Å/min., said method comprising the steps of:

a. providing an oxygen gas flow rate during film deposition of at least 50 SCCM;

b. providing an oxygen gas pressure during film deposition of 10 to 1000 mTorr;

c. providing a target-to-substrate distance of 40 to 100 mm;

d. providing a substrate temperature of 600° to 800° C.;

e. providing a laser energy density on the target surface of at least 1 $J/cm^2$; and f. providing laser pulse energy of at least 10 mJ;

wherein said high temperature oxide superconducting film so formed maintains a critical current density that is comparable to a critical current density of said high temperature oxide superconducting film formed using laser ablation at a deposition rate of less than 2000 Å/min.

2. The method of reducing grain boundaries of a high temperature oxide superconducting film in accordance with claim 1, wherein said oxide superconducting material has a composition of Y-Ba-Cu-O.

* * * * *